United States Patent [19]
Kimura

[11] Patent Number: 5,404,378
[45] Date of Patent: Apr. 4, 1995

[54] DISTORTION COMPENSATING CIRCUIT
[75] Inventor: Kazuo Kimura, Hyogo, Japan
[73] Assignee: Mitsubishi Denki Kabushiki Kaisha, Tokyo, Japan
[21] Appl. No.: 222,530
[22] Filed: Apr. 4, 1994
[30] Foreign Application Priority Data Apr. 20, 1993 [JP] Japan .................. 5-093135

[51] Int. Cl.6 .............................. H04L 25/49
[52] U.S. Cl. ..................... 375/296; 332/123; 332/124; 330/149; 455/63; 327/317
[58] Field of Search ...... 375/60, 39; 332/123, 332/124, 159; 330/149; 328/162, 163; 455/63, 126; 307/491

[56] References Cited
U.S. PATENT DOCUMENTS

| 4,291,277 | 9/1981 | Davis et al. ............ 330/149 |
| 4,700,151 | 10/1987 | Napala ................. 375/60 |
| 4,985,688 | 1/1991 | Nagata ................ 332/123 |
| 5,093,637 | 3/1992 | Isota et al. ............. 375/60 |
| 5,107,520 | 4/1992 | Karam et al. .......... 375/60 |
| 5,148,448 | 9/1992 | Karam et al. .......... 375/60 |

FOREIGN PATENT DOCUMENTS

| 61-214843 | 9/1986 | Japan . |
| 530147 | 2/1993 | Japan . |
| 9220146 | 11/1992 | WIPO ................. 330/149 |

Primary Examiner—Stephen Chin
Assistant Examiner—T. Ghebretinsae
Attorney, Agent, or Firm—Rothwell, Figg, Ernst & Kurz

[57] ABSTRACT

In a distortion compensating circuit, an initial value sufficient to provide a distortion compensating effect is previously set in a memory storage for storing distortion compensating data, whereby the convergence time of the distortion compensating effect is shortened.

9 Claims, 9 Drawing Sheets

DISTORTION COMPENSATING CIRCUIT

BACKGROUND OF THE INVENTION

1. Field of the Invention

The present invention relates to a distortion compensating circuit for compensating nonlinear distortion of the output signal of an amplifier for amplifying a transmitting power, by a digital modulation using, for example, a quadrature modulation such as a quadrature amplitude modulation (hereinafter referred to as QAM).

2. Description of the Related Art

FIG. 1 is a diagram showing a conventional distortion compensating circuit disclosed in, for example, a Japanese Patent Publication (Kokai) No. 61-214843. In FIG. 1, reference numeral 1 is an input terminal to which a transmitting bit series 10 is inputted, 2 is an output terminal from which a modulated output is outputted, and 3 is a clock terminal to which sampling clocks 21 are inputted.

Also, reference numeral 100 is a mapping circuit for generating symbolic codes 20a and 20b from the transmitting bit series, and 200 is a waveform shaping filter for generating sampled values 30a and 30b sampled from the symbolic codes 20a and 20b, by using a read-only memory (hereinafter referred to as a ROM). Reference numeral 300 is a distortion compensating circuit, called as an adaptive digital predistorter, for compensating a nonlinear distortion generated when an amplification is effected by a later described power amplifier.

Reference numeral 400 is the afore-mentioned power amplifier as an amplifier, and 401 is a coupler for taking out a part of the output signal of the power amplifier 400. Reference numeral 402 is an attenuator for attenuating the signal taken out from the coupler 401.

In the waveform shaping filter 200, reference numeral 210 is a frequency divider by dividing the sampling clocks 21 into $2^N$ (where, N is an integer) to form symbolic clocks 22, and 211 is a $2^N$ counter for counting the afore-mentioned sampling clocks. Reference numeral 212 is a shift register for shifting the symbolic codes 20a and 20b in response to the afore-mentioned symbolic clocks 22, and 213 is a read-only memory (ROM) from which the sampled values 30a and 30b are read by using the counted value from the afore-mentioned counter 211 and the contents of the afore-mentioned shift register 212.

In the distortion compensating circuit 300, reference numeral 310 is a random-access memory (hereinafter referred to as a RAM) to which a reading address formed by the outputs 23a and 23b of the afore-mentioned shift register 212 and the output 24 of the afore-mentioned counter 211 is given for outputting a distortion compensating value to compensate the non-linearity of the output of the power amplifier 400, and 311 is a first adding circuit for adding the distortion compensating value outputted from the RAM 310 and the afore-mentioned sampled values 30a and 30b. The RAM 310 and the first adding circuit 311 constitute distortion pre-correcting means. Reference numeral 312 is a digital to analog converter (hereinafter referred to as a D/A converter) for converting a digital value outputted from the first adding circuit 311 into an analog value, 313 is an oscillator for generating a carrier wave, and 314 is a quadrature modulator for modulating the carrier wave outputted from the oscillator 313 by the output of the D/A converter 312.

Reference numeral 315 is a quadrature demodulator for demodulating a part of the output taken out from the output of the afore-mentioned power amplifier 400 by the afore-mentioned coupler 401, and 316 is an analog-to-digital converter (hereinafter referred to as an A/D converter) for converting an analog value outputted from the quadrature demodulator 315 into a digital value. Reference numeral 317 is a subtracting circuit which is comparing means for subtracting the output of the A/D converter 316 from the afore-mentioned sampled values 30a and 30b, 318 is a correcting amount generating circuit for calculating, based on the output of the subtracting circuit 317, an amount for correcting the contents in the afore-mentioned RAM 310, and 319 is a calculating circuit for adding the output of the correcting amount generating circuit 318 and the output of the afore-mentioned RAM 310, or for subtracting the output of the correcting amount generating circuit 318 from the output of the afore-mentioned RAM 310, and, based on the output, for adaptively rewriting the contents in the RAM 310.

Next, an operation will be described. The modulation may be any type as long as it is a digital modulation which is capable of carrying out the quadrature modulation. Here, an explanation will be given for the case in which, as an example of the modulation, the 16-value QAM is employed, and the arrangement of the signal points in the phase plane is as shown in FIG. 2.

The mapping circuit 100 generates the symbolic codes 20a and 20b from the transmitting bit series 10 inputted into the input terminal 1. Here, 20a represents the symbolic codes of the same-phase component (I component), and 20b represents the symbolic codes of the orthogonal component (Q component). In the following description, the suffix a is added to the I component of the signal, and the suffix b is added to the Q component of the signal.

In the 16-value QAM, there are several methods of mapping in the mapping circuit 100. For example, the symbolic codes 20a and 20b are generated from the transmitting bit series 10 as follows. First, the transmitting bit series 10 is cut into every four bits to be $C_{00}$, $C_{10}$, $C_{20}$, $C_{30}$ | $C_{01}$, $C_{11}$, $C_{21}$, $C_{31}$ | . . . | $C_{0n}$, $C_{1n}$, $C_{2n}$, $C_{3n}$ | . . . . Then, $S_{0n}$ and $S_{1n}$ are determined by the flowing expressions:

$$S0n = \sum_{k=0}^{n} (2C0k + C1k) \pmod 4$$

$$S1n = \sum_{k=0}^{n} (2C2k + C3k) \pmod 4$$

Assuming that each of the symbolic codes 20a of the I components are expressed by (a0n, a1n), and each of the symbolic codes 20b of the Q components are expressed by (b0n, b1n), then the symbolic codes (a0n, a1n) and (b0n, b1n) are determined in such a way that the Gray code expression for the S0n is a0nb0n and the Gray code expression for the S1n is a1nb1n. By generating impulses having voltages $-3a$, $-a$, $a$, and $3a$ at symbol points for the symbol codes (00), (01), (10), and (11) of the thus obtained I and Q components, the signal point arrangement shown in FIG. 2 can be obtained.

The thus generated I components and the Q components of the base band signal are, as shown in FIG. 3A as an example, discontinuous waveforms in time. Usually, in order to limit the band of the modulated waves, the base band signal is passed through a not-shown low-pass filter (hereinafter referred to as a LPF) to obtain a continuous waveform as shown in FIG. 3B.

When a unit impulse is inputted into the LPF, a response waveform is assumed to be generated in the three symbol intervals before and after the symbol point, as shown in FIG. 4A as an example, or the response waveform at the intervals other than the three symbol intervals is assumed to be so small as to be negligible. Then, when the impulse series as shown in FIG. 4A are inputted into the LPF, the output waveform outputted from the LPF in a certain symbol interval is a combolution of the impulse response waveforms of the three symbols before the symbol interval and the tree symbols after the symbol interval.

The waveform in the symbol interval is sampled by a sampling clock which is $2^N$ (where N is an integer) multiplied by the symbolic clock, and is quantized with a resolution of B bits (where B is an integer). In FIG. 4B, a case for N=3 is shown in which black dots on a waveform represent the respective samples, and are denoted by numbers n=0, n=1, ..., n=7 from the top of the symbol interval.

As described above, in the output of the LPF, the sampling value at any position of any symbol interval can be determined by determining K symbols before the symbol interval, K symbols after the symbol interval, and the position in the symbol interval. Accordingly, by previously calculating sampling values for all combination of the symbols and for all positions, and by storing the values quantized by B bits in a memory storage, the output waveforms of the LPF can be obtained by reading the contents in the memory storage with reading addresses equal to the position information of the K symbols before the symbol interval and K symbols after the symbol interval and the position information of the sample.

The waveform shaping filter 200 operates based on the above-described principle. The sampling clock 21 inputted from the clock terminal 3 is divided by $2^N$ by the frequency divider 210 to be the symbolic clocks 22 which drive the shift register 212 to shift the symbol codes 20a and 20b outputted from the mapping circuit 100. The shift register 212 always store the newest 2K symbolic codes so that the outputs 23a and 23b give the symbolic codes of the K symbols before the symbol interval and the K symbols after the symbol interval.

Also, the $2^N$ counter 211 counts the sampling clocks 21 to output the position in the symbol clock. By using the outputs 23a and 23b of the shift register 212 and the position information outputted from the counter 211 as a reading address, the contents of the ROM 213, which previously stores the above-mentioned sampling values for all combination of the symbols and for all positions, is read to obtain the sampling values 30a and 30b.

To compensate a nonlinear distortion generated when a modulated signal is amplified by the power amplifier 400 after the orthogonal modulation of the carrier wave 313 by using the sampled values 30a and 30b of the base band signal, the distortion compensating circuit 300 operates as follows. Namely, for each sampled value, a part of the output of the power amplifier 400 is taken out to be demodulated by the orthogonal demodulator 315, and a difference between the sampled value and the demodulated value is obtained by the subtracter 317. Thereby, the distortion amount in the power amplifier 400 with respect to the sampled value can be determined and is stored in the RAM 310. When the same sampled value appears again in the base band signal, a distortion equivalent to the distortion provided by the power amplifier 400 has been previously added to the sampled value in the reverse direction so that the distortion by the power amplifier 400 can be canceled. This is effected by reading the distortion value of the sampled value previously stored in the memory storage 310, and by adding it to the sampled value of the base band signal.

In the following, the operation of the circuit shown in FIG. 1 will be described. The RAM 310 is reset at the initial time of operation so that a distortion correcting amount 0 is stored therein. After starting the operation, the first adding circuit 311 adds the sampled values 30a, 30b, and the outputs of the RAM 310, to obtain the base band signals 31a and 31b. The address of the RAM 310 is designated by using the position information 23a and 23b in the symbol interval of the sampled value outputted from the counter 211 in the wavaform shaping filter 200, and the symbolic codes 24 before and after the sampled value outputted from the shift register 212. The base band signals 31a and 31b are converted into analog signals by the D/A converter 312. The orthogonal modulator 314 modulates the carrier wave 313 by the output of the D/A converter 312. The modulated carrier wave is amplified by the power amplifier 400 and is outputted from the output terminal 2.

A part of the output of the power amplifier 400 is taken out by the coupler 401 and is attenuated to an appropriate level by the attenuator 402 and is demodulated into a base band signal by the orthogonal demodulator 315. The base band signal is converted into digital values by the A/D converter 316, and are subtracted from the sampled values 30a and 30b which are to be transmitted. Since the RAM 310 does not store the distortion correcting amount for canceling the distortion due to the non-linearity of the power amplifier 400 immediately after the start of the operation of the power amplifier 400 and the distortion compensating circuit 301, the output of the subtracting circuit 317 is not zero so that the distortion amount due to the non-linearity is outputted. When the same sampled values again appear in the base band signals 30a and 30b, the sign (+/±) of this distortion amount and the correcting amount of the distortion are adjusted in such a way that a distortion added by the power amplifier 400 is canceled. The distortion correcting amount is stored in the RAM 310. Namely, the correcting amount generating circuit 318 multiplies $\alpha$ ($0 < \alpha \leq 1$) with the output of the subtracting circuit 317 and outputs it. The subtracting circuit 319 adds the output of the correcting amount generating circuit 317 and the output of the RAM 310 and writes it into the RAM 310. In this way, the compensating distortion amount is adaptively controlled and rewritten in the RAM 310.

As a reference document disclosing a circuit similar to the above-mentioned conventional distortion compensating circuit, there is a Japanese Patent Publication (Kokai) No. 61-214843 as an example. As a reference document disclosing the waveform shaping filter 200 using the ROM, there are a paper entitled "Digital Filter-Modulation Combination for Data Transmission" written by N. Boutin, et al., IEEE transaction on Communication, volume 25, No. 10, October, 1977, and so forth. FIG. 5 shows a time chart of the operation of the distortion compensating circuit. The write control to the RAM 310 is carried out when the distortion compensating circuit starts to operate so that the distortion compensation effect is gradually increased until it is converged into a certain value which provides a sufficient effect. When the power is cut or when the operation is stopped, the write control is reset. Each time the distortion compensating circuit starts to operate, the write control of the RAM 310 is carried out so that the distortion compensation effect is gradually increased until it is converged into a certain value which provides a sufficient effect. This operation is repeated.

Since the conventional distortion compensating circuit is constructed as above, the contents of the RAM 300 are reset each time the power amplifier 400 and the distortion compensating circuit 300 start to operate. Therefore, almost all values in the RAM 310 must be rewritten in the time interval from the start of the operation of the distortion compensating circuit 300 to the convergent state in which the sufficient effect for the distortion compensation is obtained. As a result, as shown in FIG. 5, there is a problem in that it takes a long time each time from the start of the operation of the distortion compensating circuit 300 to the convergent state of the distortion compensating effect.

SUMMARY OF THE INVENTION

In view of the foregoing, it is an object of the present invention to provide a distortion compensating circuit which can shorten the time from the start of on or after the second operation of the distortion compensating circuit to the convergent state in which a sufficient distortion compensating effect is obtained.

According to the first aspect of the present invention, for achieving the above-mentioned objects, there is provided a distortion compensating circuit for compensating a nonlinear distortion generated in an amplifier for amplifying a signal modulated by a base band signal. The distortion compensating circuit comprises distortion correcting means that is intermittently operated, including a memory storage for storing distortion compensating data for compensating the nonlinear distortion in the output of the amplifier, and a subtracter for subtracting the distortion compensating data in the memory storage from the base band signal to output a corrected base band signal, a modulator for modulating a carrier signal by the corrected base band signal outputted from the distortion correcting means to output a modulated signal to the amplifier, a demodulator for demodulating a part of the signal outputted from the amplifier, comparing means for comparing the demodulated signal outputted from the demodulator with the base band signal to output the distortion compensating data to the memory storage, and initial value setting means for setting an initial value of the distortion compensating data in the memory storage. The initial value is sufficient for compensating the distortion.

According to the second aspect of the present invention, the initial value is the distortion compensating data generated at the end of the previous operating period of the distortion correcting means.

According to the third aspect of the present invention, the initial value is determined by a combination of a temperature, an amplification degree, an output level, a power supply voltage, an output impedance, and an input impedance of the amplifier.

As stated above, according to the present invention, before operating the distortion compensating circuit and the amplifier, the initial value of the distortion compensating amount is not started from zero but a certain distortion compensating value, taking into account the distortion compensating value at the end of a previous operation, the circumferential temperature of the amplifier, the amplification degree, the output level of the amplifier, and so forth, whereby the convergence time of the distortion compensating effect is greatly shortened.

The above and further objects and novel features of the invention will more fully appear from the following detailed description when the same is read in connection with the accompanying drawings. It is to be expressly understood, however, that the drawings are for purpose of illustration only and are not intended as a definition of the limits of the invention.

DESCRIPTION OF THE PREFERRED EMBODIMENTS

Embodiment 1

Figure 1:
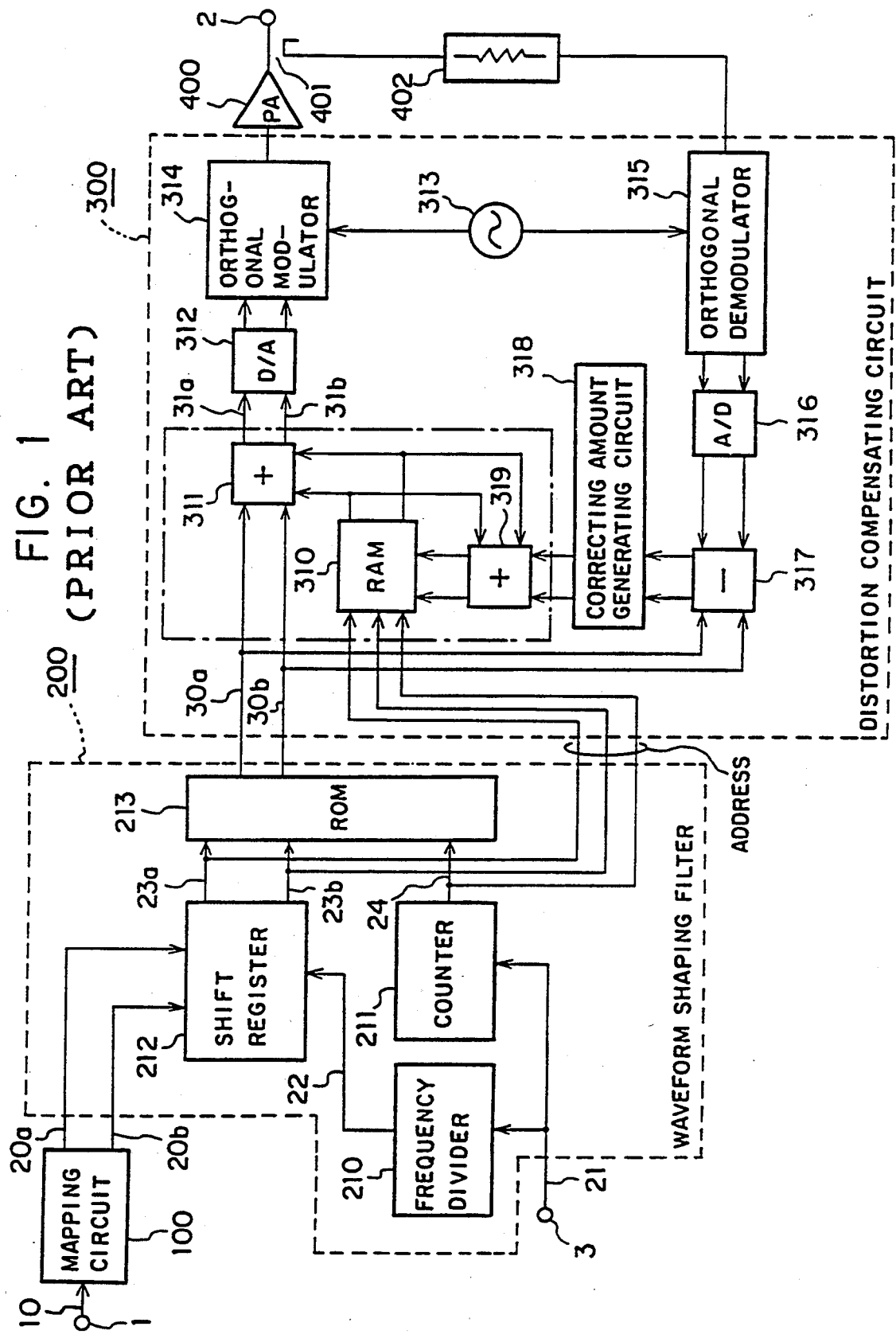
FIG. 1 is a block diagram showing an example of a modulating apparatus employing a conventional distortion compensating circuit.
Figure 2:
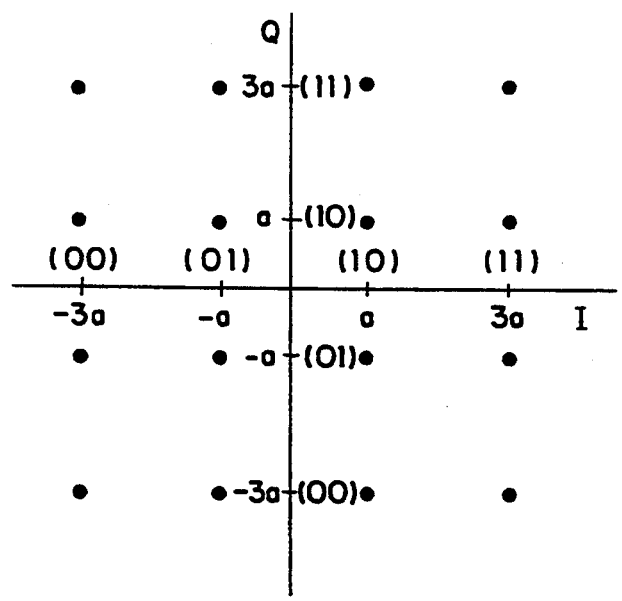
FIG. 2 is a diagram explaining an arrangement of signal points in the 16-value QAM.
Figure 3A:
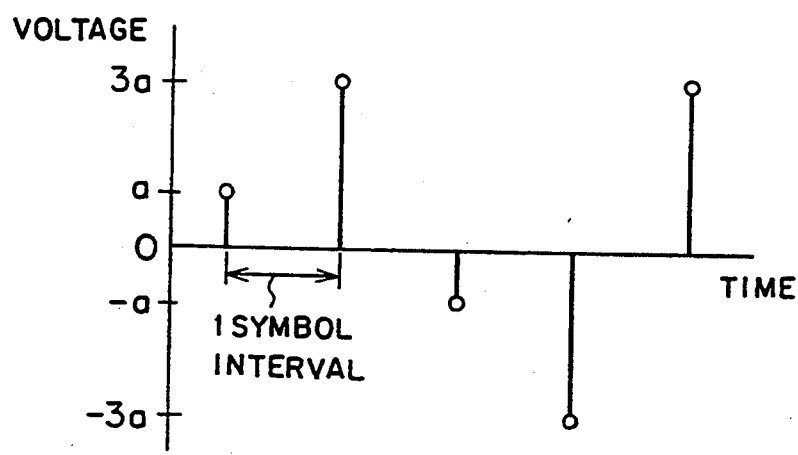
FIG. 3A is a waveform diagram showing a base band signal before passing a low-pass filter.
Figure 3B:
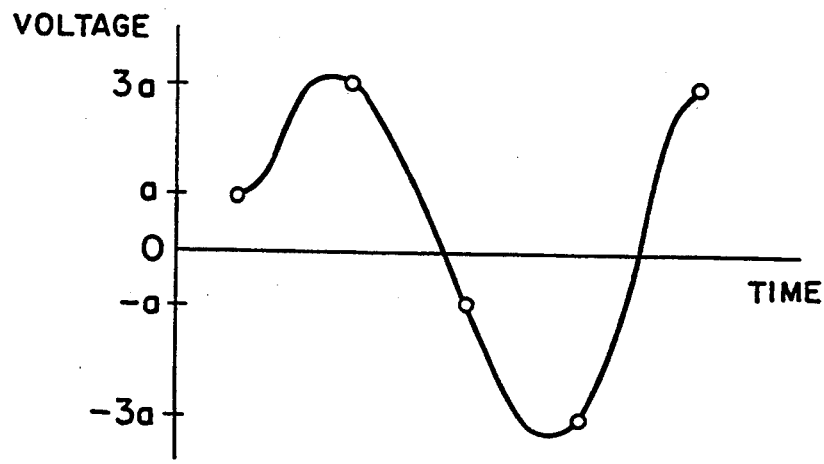
FIG. 3B is a waveform diagram showing a base band signal after passing a low-pass filter.
Figure 4A:
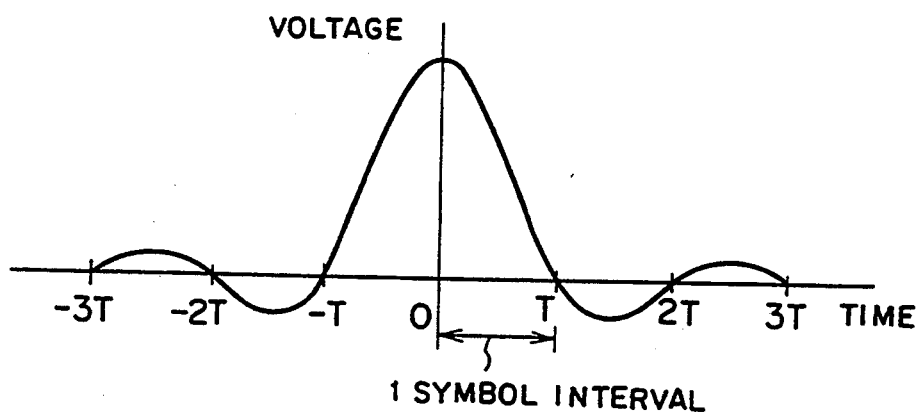
FIG. 4A is a waveform diagram showing an impulse response of a band limiting filter.
Figure 4B:
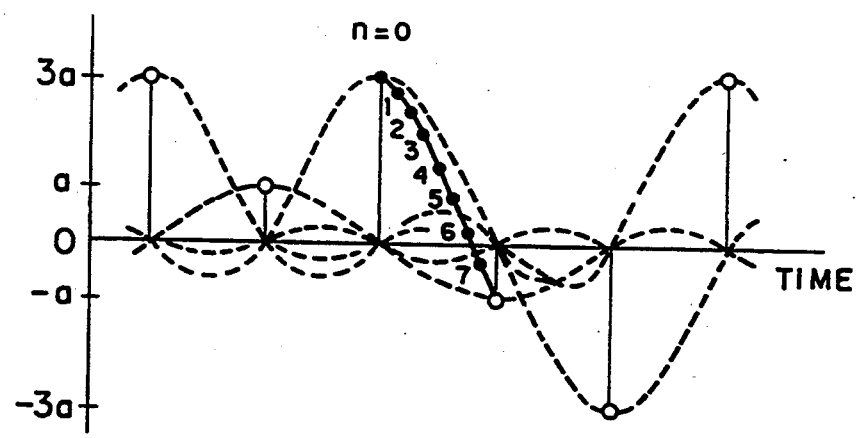
FIG. 4B is a waveform diagram showing a superposition of the impulse waveforms.
Figure 5:
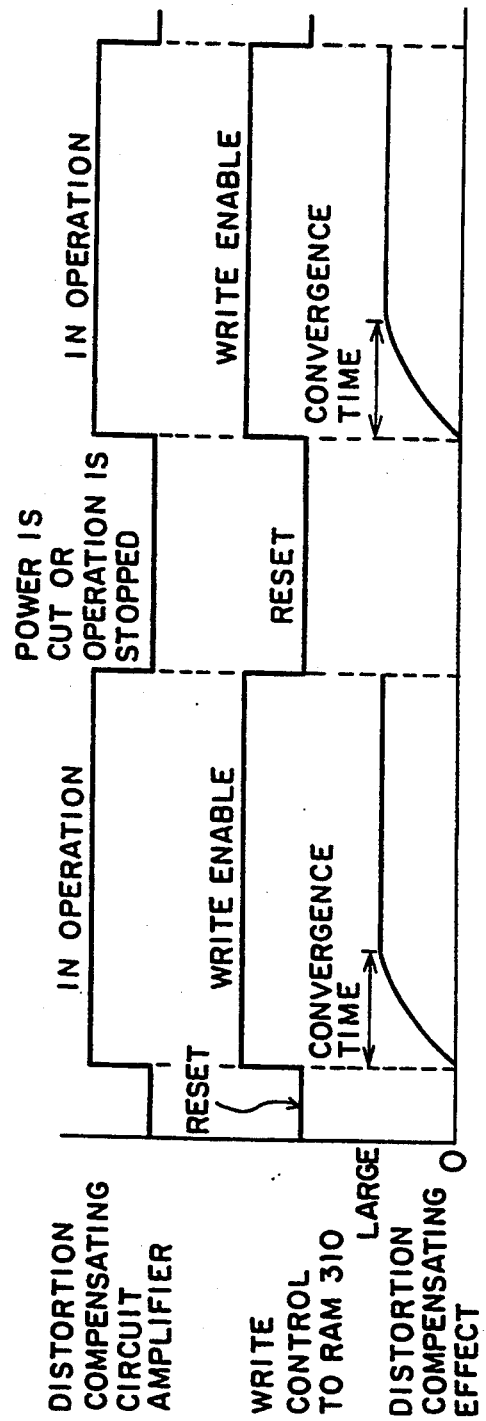
FIG. 5 is a diagram explaining the relation among the operation of the conventional distortion compensating circuit, the write control to a memory (RAM), and the distortion compensating effect in the conventional distortion compensating circuit.
Figure 6:
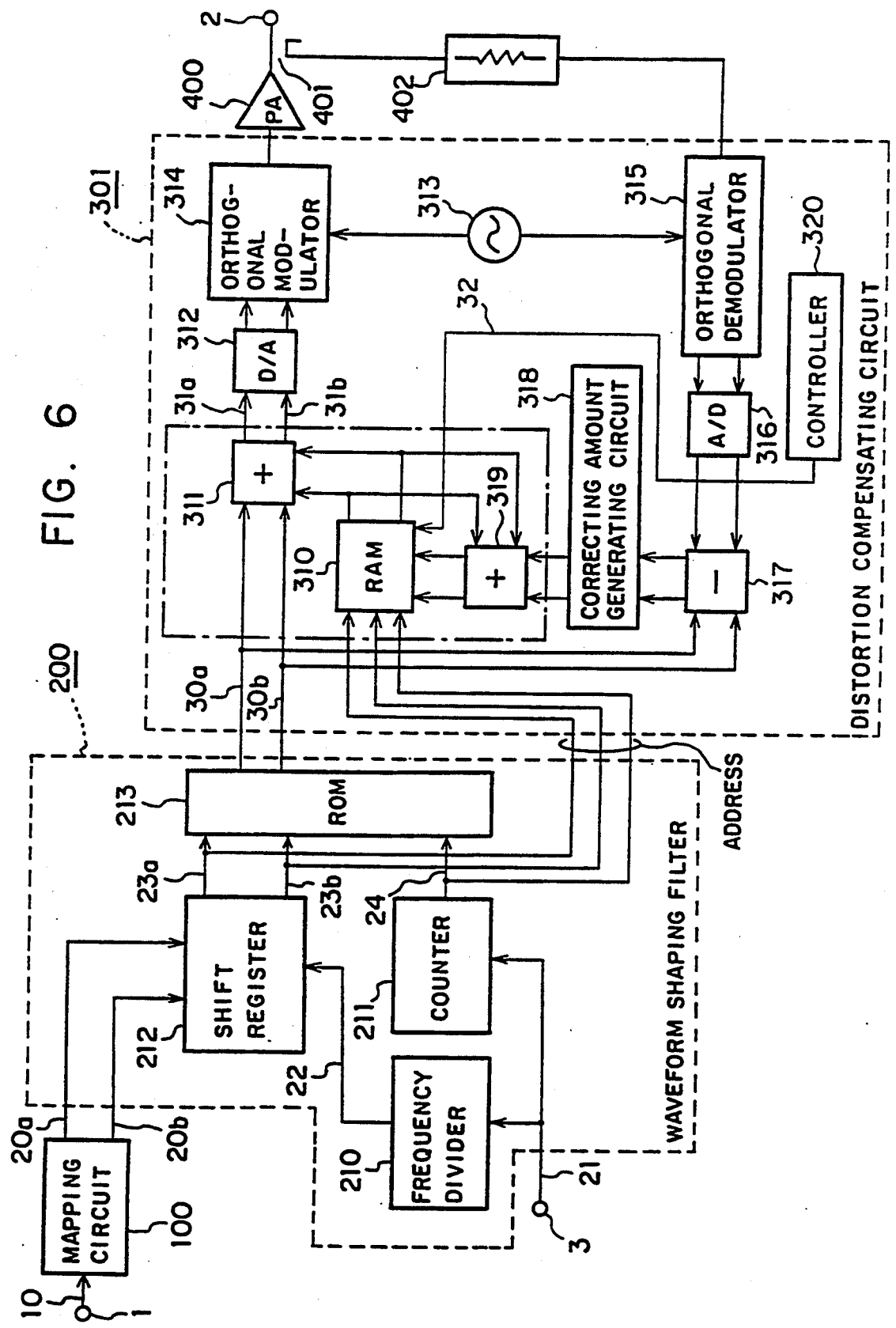
FIG. 6 is a block diagram showing modulating apparatus employing a distortion compensating circuit according to an embodiment of the present invention.

In the following, an embodiment of the present invention will be described with reference to the drawings. FIG. 6 is a block diagram showing a modulating apparatus employing a distortion compensating circuit according to an embodiment of the present invention. In the figure, the same reference numerals as those in the conventional modulating apparatus represent the same or corresponding parts. Describing these parts again, reference numeral 1 is an input terminal to which a transmitting bit series 10 is inputted, 2 is an output terminal from which a modulated output is outputted, and 3 is a clock terminal to which sampling clocks 21 are inputted.

Also, reference numeral 100 is a mapping circuit for generating symbolic codes 20a and 20b from the transmitting bit series, and 200 is a waveform shaping filter for generating sampled values 30a and 30b sampled from the symbolic codes 20a and 20b, by using a read-only memory (hereinafter referred to as a ROM). Reference numeral 300 is a distortion compensating circuit, called as an adaptive digital predistorter, for compensating a nonlinear distortion generated when an amplification is effected by a later described power amplifier.

Reference numeral 400 is the afore-mentioned power amplifier as an amplifier, and 401 is a coupler for taking out a part of the output signal of the power amplifier 400. Reference numeral 402 is an attenuator for attenuating the signal taken out from the coupler 401.

In the waveform shaping filter 200, reference numeral 210 is a frequency divider by dividing the sampling clocks 21 into $2^N$ (where, N is an integer) to form symbolic clocks 22, and 211 is a $2^N$ counter for counting the afore-mentioned sampling clocks. Reference numeral 212 is a shift register for shifting the symbolic codes 20a and 20b in response to the afore-mentioned symbolic clocks 22, and 213 is a read-only memory (ROM) from which the sampled values 30a and 30b are read by using the counted value from the afore-mentioned counter 211 and the contents of the afore-mentioned shift register 212.

In the distortion compensating circuit 301, reference numeral 310 is a random-access memory (hereinafter referred to as a RAM) to which a reading address formed by the outputs 23a and 23b of the afore-mentioned shift register 212 and the output 24 of the afore-mentioned counter 211 is given for outputting a distortion compensating value to compensate the non-linearity of the output of the power amplifier 400, and 311 is a first adding circuit for adding the distortion compensating value outputted from the RAM 310 and the afore-mentioned sampled values 30a and 30b. The RAM 310 and the first adding circuit 311 constitute distortion pre-correcting means. Reference numeral 312 is a digital to analog converter (hereinafter referred to as a D/A converter) for converting a digital value outputted from the first adding circuit 311 into an analog value, 313 is an oscillator for generating a carrier wave, and 314 is a quadrature modulator for modulating the carrier wave outputted from the oscillator 313 by the output of the D/A converter 312.

Reference numeral 315 is a quadrature demodulator for demodulating a part of the output taken out from the output of the afore-mentioned power amplifier 400 by the afore-mentioned coupler 401, and 316 is an analog-to-digital converter (hereinafter referred to as an A/D converter) for converting an analog value outputted from the quadrature demodulator 315 into a digital value. Reference numeral 317 is a subtracting circuit which is comparing means for subtracting the output of the A/D converter 316 from the afore-mentioned sampled values 30a and 30b, 318 is a correcting amount generating circuit for calculating, based on the output of the subtracting circuit 317, an amount for correcting the contents in the afore-mentioned RAM 310, and 319 is a calculating circuit for adding the output of the correcting amount generating circuit 318 and the output of the afore-mentioned RAM 310, or for subtracting the output of the correcting amount generating circuit 318 from the output of the afore-mentioned RAM 310, and, based on the output, for adaptively rewriting the contents in the RAM 310.

According to the embodiment of the present invention, there is provided a controller 320 for controlling the RAM 310 to allow or not to allow a write-in operation of the output of the calculating circuit 319 into the RAM 310.

Figure 7:
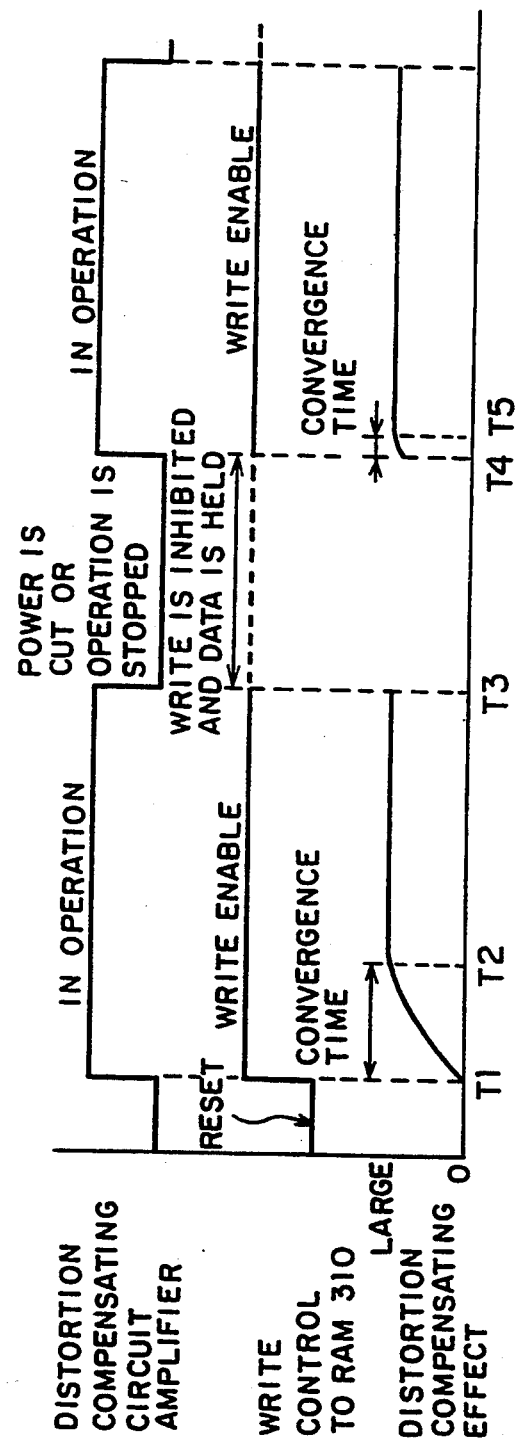
FIG. 7 is diagram explaining the relation among the operation of the distortion compensating circuit, the write control to a memory (RAM), and the distortion compensating effect in the distortion compensating circuit shown in FIG. 6.

Next, the operation of the apparatus shown in FIG. 6 will be described with reference to FIG. 7. Here, since the basic operation is similar to the one in the conventional apparatus, the explanation thereof is omitted. The write control in the RAM 310 is mainly described. In the first operation of the distortion compensating circuit 301 and the power amplifier 400, the operation is the same as that in the conventional circuit. Namely, the RAM 310 is reset before the starting time T1 of the write control to the RAM 310 so that the distortion correcting amount stored in the RAM 310 is zero at the starting time T1 of the operation of the distortion compensating circuit 301. Therefore, the convergence time is long. After the convergence of the distortion compensating effect is finished at a time T2 after a sufficient time has passed from the time T1, the data which has been written in the RAM 310 is sufficient to compensate the nonlinear distortion of the power amplifier 400. Then, when the amplifying operation and the distortion compensating operation are to be temporarily stopped at a time T3 for example, the controller 320 inhibits to write data from the calculating circuit 319 into the RAM 310.

If the power supply is cut at the time T3, the controller 320 inhibits to write data into the RAM 310 and, at the same time, the controller 320 keeps a power to be supplied to at least the RAM 310 to back up it in order to prevent the destruction of the contents in the RAM 310. When the distortion compensating circuit 301 and the power amplifier 400 are to be operated again, the contents in the afore-mentioned backed up RAM 310 are used as an initial value, and then the controller 320 enables the RAM 310 to be written data therein.

Embodiment 2

Figure 8:
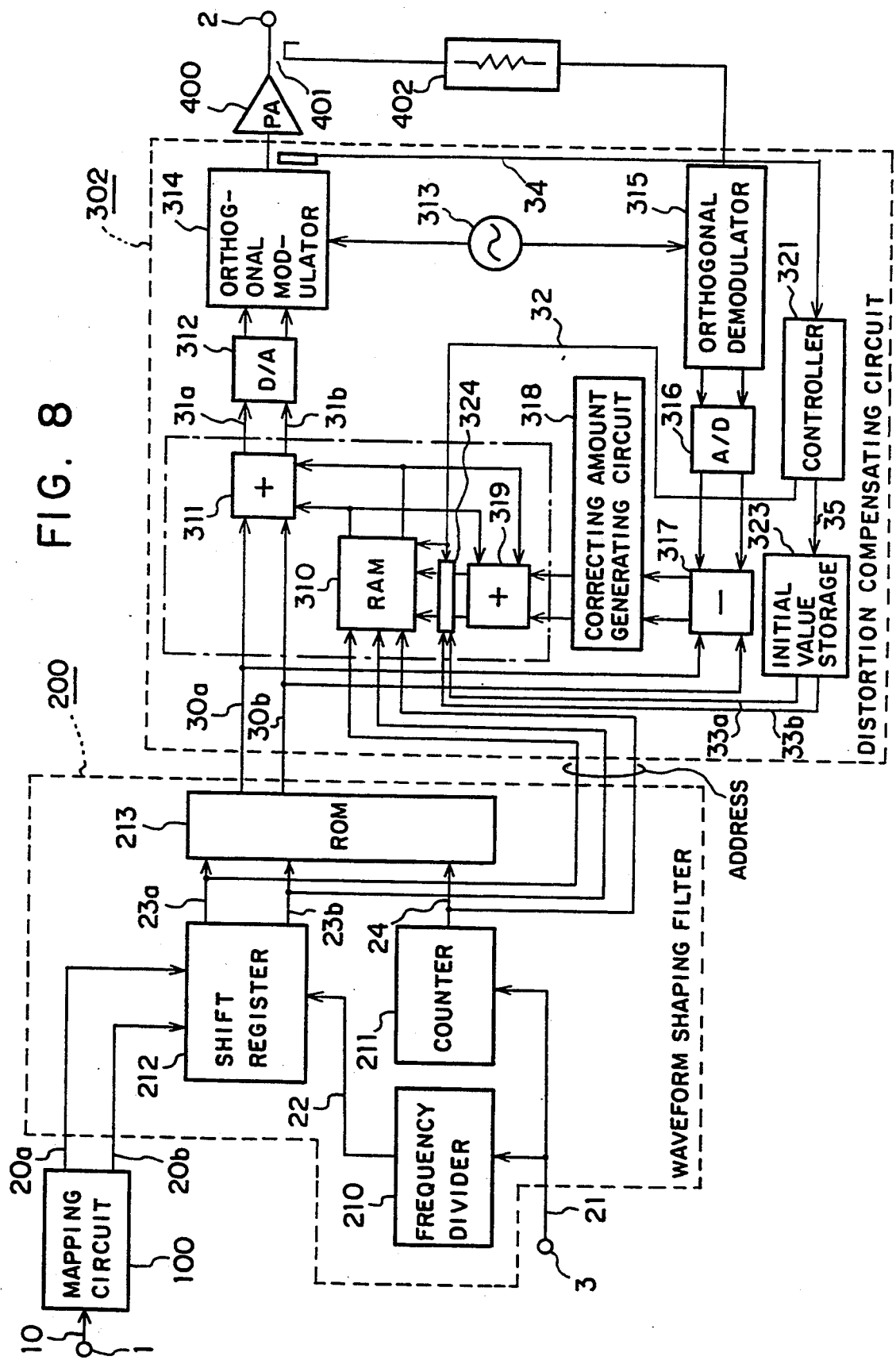
FIG. 8 is a block diagram showing a modulating apparatus employing a distortion compensating circuit according to anther embodiment of the present invention.

In the following, a distortion compensating circuit according to another embodiment of the present invention will be described with reference to FIG. 8. In FIG. 8, the same reference numerals as those in FIG. 6 represent the same or corresponding parts in the conventional apparatus, and the explanations thereof are omitted here.

Reference numeral 322 is a temperature sensor for detecting a temperature which has strong correlation with the non-linearity of the power amplifier 400. Reference numeral 321 is a controller for outputting, based on the temperature read by the temperature sensor 322, a selecting signal for selecting an optimum value as an initial value for the distortion compensation, for controlling the write operation to the RAM 310, and for effecting a switching control of a write-data switching unit 324 for selecting data to be written into the RAM 310. Reference numeral 323 is an initial-value memory storage for storing one or more of initial values for distortion compensation, and for outputting an initial value designated by the controller 321 to the write-data switching unit 324. Reference numeral 324 is the write-data switching unit controlled by the controller 321 for selecting either one of the output of the calculating circuit 319 and the output of the initial value memory storage 322 to output to the RAM 310.

Next, the operation of the apparatus shown in FIG. 8 will be described. Here, since the basic operation is similar to the one in the apparatus according to the embodiment 1, the explanation thereof is omitted. The write control in the RAM 310 is mainly described. Immediately before starting the operation of the distortion compensating circuit 302 and the power amplifier 400, the temperature sensor 322 detects a temperature of the power amplifier 400 and outputs temperature data 34 to the controller 321. The temperature of the power amplifier 400 is strongly correlated with the nonlinear distortion characteristic of the power amplifier 400. Based on the temperature data 34, the controller 321 outputs a signal for selecting a distortion compensating initial value which is optimum for the detected temperature to the initial value memory storage 323. The initial value memory storage 323 previously stores initial values optimum for respective temperature ranges of, for example, $-10°$ C. to 20° C., 20° C. to 50° C., and so forth. In response to the selecting signal 35 from the controller 321, the initial value memory storage 323 selects an initial value and outputs it to the write-data switching unit 324. The write-data switching unit 324 selects the output of the initial value memory storage 323 before starting the operation of the distortion compensating circuit. After the initial value is written into the RAM 310, the controller 321 controls the write-data switching unit 324 so that the write-data switching unit 324 selects the output of the calculating circuit 319.

Embodiment 3

Figure 9:
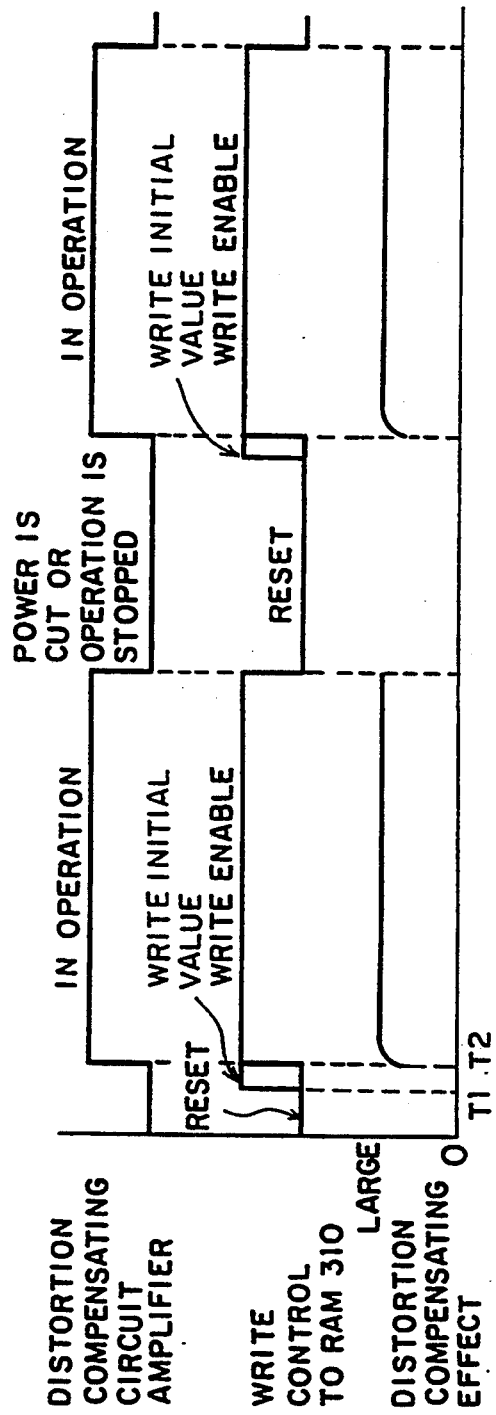
FIG. 9 is diagram explaining the relation among the operation of the distortion compensating circuit, the write control to a memory (RAM), and the distortion compensating effect in the distortion compensating circuit shown in FIG. 8.

A distortion compensating circuit according to still another embodiment of the present invention will be described. The circuit construction of the distortion compensating circuit of this embodiment is the same as the that shown in FIG. 8. The difference between the above-mentioned embodiment 2 and this embodiment is that, in this embodiment, the initial value memory storage 323 stores distortion compensating initial values which are optimum not only for the respective temperature ranges but also for respective amplification degrees, for example, 0.1 w to 1 w, 1 w to 5 w, and so forth. In operation, as shown in FIG. 9, before starting the distortion compensating operation and the amplification operation, the optimum initial value is selected from the initial-value memory storage 323 and is written into the RAM 310 at a time T1 immediately before the start of the distortion compensating operation at a time T2.

In the above-described embodiment, the initial values depend on temperatures and amplification degrees as parameters, however, as parameters deeply correlated to the distortion characteristic of the power amplifier 400, there are a power supply voltage of the power amplifier (in an apparatus mounted in a car, the power supply voltage largely fluctuates between 9 v and 16 v, and, in order to save energy, the power amplifier is usually operated with the fluctuating power supply voltage), an output impedance of the power amplifier, an input impedance of the power amplifier, an input level of the power amplifier, and so forth. Under the condition in which these parameters are combined, it may also be possible, according to an embodiment of the present invention, to carry out a distortion compensating operation until the distortion compensating effect converges to a certain value, and then the distortion compensating data, stored in the RAM 310 when the convergence of the distortion compensating effect is completed, is stored as initial value data of the combination of the parameters in the initial value memory storage 323. This operation is called "training". By training as described above, a further improved distortion compensation can be attained.

When the above-described embodiment employing the training process is applied to a transmitter, by connecting the output of the transmitter to a dummy load during the training period, the output energy of the power amplifier is consumed by the dummy load during the training period in which the transmitted radio wave has a large distortion. As a result, the transmission is effected only during a period in which the distortion is small. Thus, there is an effect in that a radio wave having a large distortion needs not to be transmitted.

From the foregoing description, it will be apparent that, according to the first aspect of the present invention, since the distortion compensating circuit comprises initial value setting means for setting an initial value of distortion compensating data in a memory storage, and the initial value is sufficient to compensate the distortion, the convergence time of the distortion compensating effect can be shortened.

According to the second aspect of the present invention, since the initial value is the distortion compensating data generated at the end of the previous operating period of the distortion correcting means, The convergence time of the distortion compensating effect can be shortened in accordance with the previously generated distortion compensating data.

According to the third aspect of the present invention, since the initial value is determined by any combination of a temperature, an amplification degree, an output level, a power supply voltage, an output impedance, and an input impedance of the amplifier, the convergence time of the distortion compensating effect can be shortened in accordance with any combination of the circumferential temperature, the amplification degree, the output level, the power supply voltage, the output impedance, and the input impedance of the amplifier.

What is claimed is:

1. A distortion compensating circuit for compensating a nonlinear distortion generated in an amplifier for amplifying a signal modulated by a base band signal, comprising:

distortion correcting means that is intermittently operated, including a memory storage for storing distortion compensating data for compensating the nonlinear distortion in the output of said amplifier, and a subtracter for subtracting said distortion compensating data in said memory storage from said base band signal to output a corrected base band signal;

a modulator for modulating a carrier signal by said corrected base band signal outputted from said distortion correcting means to output a modulated signal to said amplifier; a demodulator for demodulating a part of the signal outputted from said modulator;

comparing means for comparing the demodulated signal outputted from said demodulator with said base band signal to output said distortion compensating data to said memory storage; and initial value setting means for setting an initial value of said distortion compensating data in said memory storage, said initial value being sufficient to compensate the nonlinear distortion.

2. A distortion compensating circuit as claimed in claim 1, wherein said initial value is the distortion compensating data generated at the end of the previous operating period of said distortion correcting means.

3. A distortion compensating circuit as claimed in claim 1, wherein said initial value is determined by a temperature of said amplifier.

4. A distortion compensating circuit as claimed in claim 1, wherein said initial value is determined by an amplification degree of said amplifier.

5. A distortion compensating circuit as claimed in claim 1, wherein said initial value is determined by an output level of said amplifier.

6. A distortion compensating circuit as claimed in claim 1, wherein said initial value is determined by a power supply voltage of said amplifier.

7. A distortion compensating circuit as claimed in claim 1, wherein said initial value is determined by an output impedance of said amplifier.

8. A distortion compensating circuit as claimed in claim 1, wherein said initial value is determined by an input impedance of said amplifier.

9. A distortion compensating circuit as claimed in claim 1, wherein said initial value is determined by any combination of a temperature, an amplification degree, an output level, a power supply voltage, an output impedance, and an input impedance of said amplifier.

* * * * *